US011569142B2

(12) United States Patent
Miwa (10) Patent No.: US 11,569,142 B2
(45) Date of Patent: Jan. 31, 2023

(54) SEMICONDUCTOR DEVICE COMPRISING SEALING FRAME CONFIGURED AS A CONDUCTOR (71) Applicant: Mitsubishi Electric Corporation, Tokyo (JP)

(72) Inventor: Shinichi Miwa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 111 days.

(21) Appl. No.: 16/962,211

(22) PCT Filed: Apr. 6, 2018

(86) PCT No.: PCT/JP2018/014749
§ 371 (c)(1),
(2) Date: Jul. 14, 2020

(87) PCT Pub. No.: WO2019/193750
PCT Pub. Date: Oct. 10, 2019

(65) Prior Publication Data
US 2021/0057295 A1   Feb. 25, 2021

(51) Int. Cl.
H01L 23/10  (2006.01)
H01L 23/04  (2006.01)
H01L 23/66  (2006.01)

(52) U.S. Cl.
CPC ............ H01L 23/10 (2013.01); H01L 23/041 (2013.01); H01L 23/66 (2013.01); H01L 2223/6655 (2013.01)

(58) Field of Classification Search
CPC ...................................................... H01L 23/10

USPC .......................................................... 257/684
See application file for complete search history.

(56) References Cited

U.S. PATENT DOCUMENTS

| 2003/0122638 | A1  | 7/2003 | Tarui et al. |
| 2007/0018281 | A1* | 1/2007 | Sim .......................... H01L 23/10 257/E23.07 |
| 2007/0048905 | A1* | 3/2007 | Marion ................ B81C 1/00269 438/126 |
| 2013/0343107 | A1* | 12/2013 | Perreault ................. H03F 3/211 363/67 |

(Continued)

FOREIGN PATENT DOCUMENTS

| JP | 2003197863 A | 7/2003 |
| JP | 2003234452 A | 8/2003 |
| JP | 2007027762 A | 2/2007 |

(Continued)

OTHER PUBLICATIONS

International Search Report issued in PCT/JP2018/014749; dated Jun. 19, 2018.

(Continued)

Primary Examiner — Ajay Arora
(74) Attorney, Agent, or Firm — Studebaker & Brackett PC (57) ABSTRACT This semiconductor device is provided with a device substrate in which a semiconductor circuit including two high frequency amplifiers; a cap substrate and a sealing frame of a conductor which forms and air-tightly seals space surrounding an area, in which the semiconductor circuit is formed, between the device substrate and the cap substrate, wherein the sealing frame is configured as a line of a 90-degree hybrid circuit or a line of a rat-race circuit.

8 Claims, 8 Drawing Sheets (56) References Cited

U.S. PATENT DOCUMENTS

2018/0138132 A1    5/2018  Nishizawa et al.

FOREIGN PATENT DOCUMENTS

| | | | | |
|---|---|---|---|---|
| JP | 2007067400 A | 3/2007 | | |
| WO | WO-2010052825 A1 * | 5/2010 | ........... | H03F 1/0288 |
| WO | 2017029822 A1 | 2/2017 | | |

OTHER PUBLICATIONS

An Office Action issued by the German Patent and Trademark Office dated Jun. 8, 2022, which corresponds to German Patent Application No. 112018007440.4 and is related to U.S. Appl. No. 16/962,211; with English language translation.

An Office Action issued by the German Patent and Trade Mark Office dated Oct. 14, 2022, which corresponds to German Patent Application No. 112018007440.4 and is related to U.S. Appl. No. 16/962,211; with English language translation.

\* cited by examiner

SEMICONDUCTOR DEVICE COMPRISING SEALING FRAME CONFIGURED AS A CONDUCTOR

TECHNICAL FIELD

This application relates to a semiconductor device having a hollow configuration which operates with high-frequency.

BACKGROUND ART

In general, regarding a semiconductor chip, due to water in atmosphere, corrosion, etc. of electrode is generated so as to cause a malfunction, therefore a semiconductor chip may be packaged so as to have a hollow air-tight configuration. Further, regarding a semiconductor chip which operates with high-frequency, in order to prevent instability of operation due to influence of external radio wave and a problem regarding unnecessary radiation which is emitted from a semiconductor itself, it is required for a package to have an electromagnetic shield function. Regarding a material of a package of the above mentioned chip, in general, a process of metal-cap is performed on a base material such as CuW, etc., however, it is expensive to perform a process of metal-cap, and performing the above mentioned process is a factor to increase cost. On the other hand, recently, a method, in which a semiconductor chip is packaged by chip scale (CSP: Chip Scale Package) so as to reduce a cost of packaging, has been greatly developed.

In conventional semiconductor devices having general hollow configurations (cavity), a cavity is realized by joining a device substrate and a cap substrate with a sealing frame of a conductive material (refer to Patent Document 1) or by joining a wall of a first package and a second package (refer to Patent Documents 2 and 3). A sealing frame and a wall are mounted only for realizing a cavity, and in a case where a matching circuit is mounted, it is configured such that at inner side of a sealing frame or a wall, that is, in a cavity, a matching circuit is arranged separately from a sealing frame or a wall.

PRIOR ART DOCUMENT

Patent Document

Patent Document 1: International publication WO2017/029822A1
Patent Document 2: JP 2003-234452A
Patent Document 3: JP 2003-197863A

SUMMARY OF THE INVENTION

Problems to be Solved by the Invention

Regarding conventional semiconductor devices having a hollow configuration, in order to realize miniaturization of a device and reduction of mounting area when a device is mounted in a system, a matching circuit is arranged on a cap substrate which is mounted for realizing a cavity or on a package. However, for example, in a case of a semiconductor device in which more than two amplifiers are combined in parallel such as an amplifier having a Doherty configuration, it is necessary to arrange a power distribution circuit at a side of input and a power synthesizing circuit at a side of output in addition to matching circuits at a side of input and at a side of output of each amplifier, therefore, there is no space on a cap substrate for mounting all circuits. Consequently, it is necessary to arrange a power distribution circuit, a power synthesizing circuit, etc. on a resin substrate, for example, in addition to a semiconductor device having a hollow configuration, therefore, an area of mounting is increased due to necessity of an area of mounting a power distribution circuit and a power synthesizing circuit.

This application discloses a technology to solve the above mentioned problems, and aims to further reduce an area of mounting of whole of device with a simple configuration.

Means for Solving Problems

A semiconductor device which is disclosed by this application comprises a device substrate on which a semiconductor circuit including two high frequnecy amplifiers is formed, a cap substrate and a sealing frame of a conductor which forms and air-tightly seals space surrounding an area, in which the semiconductor circuit is formed, between the device substrate and the cap substrate, and is configured as a line of a 90-degree hybrid circuit or a line of a rat-race circuit.

Advantage Effect of the Invention

According to a semiconductor device which is disclosed by this application, a sealing frame for sealing air-tightly is used as a member of a high frequency circuit, therefore, the number of members of a semiconductor device can be reduced, and an area of mounting of whole of device can be further reduced with simple configuration in comparison with a conventional semiconductor device.

EMBODIMENTS FOR CARRYING OUT THE INVENTION

Embodiment 1

Figure 1:
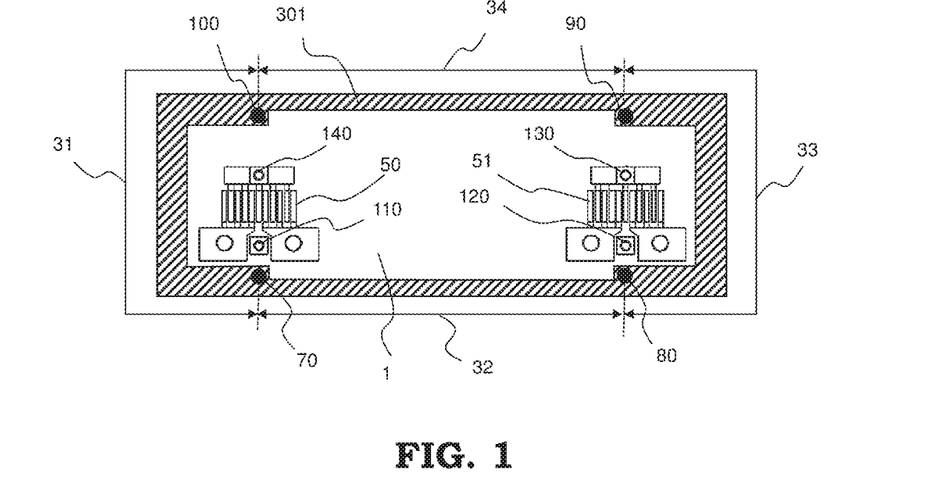
FIG. 1 is a plan view showing a basic configuration of a device substrate of a semiconductor device according to Embodiment 1.
Figure 2:
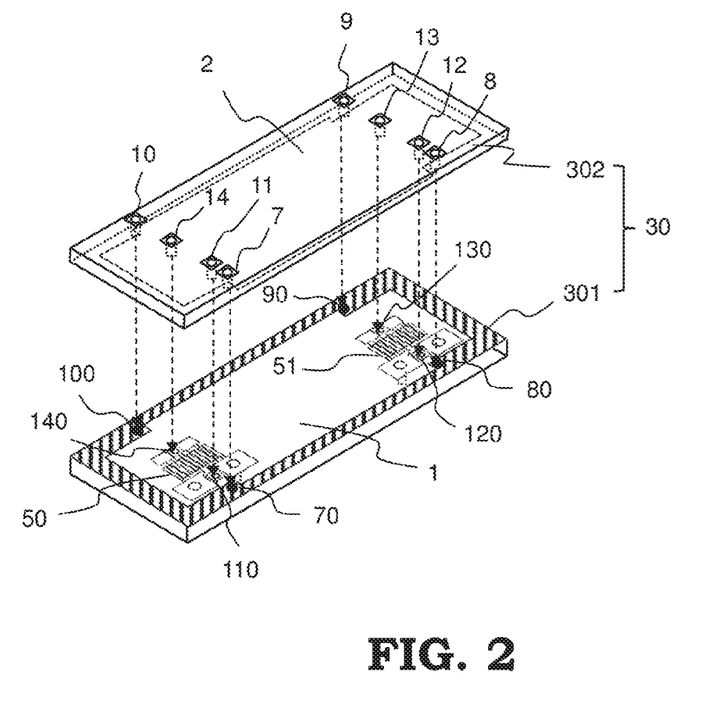
FIG. 2 is a perspective view showing a basic configuration of a semiconductor device according to Embodiment 1 in which a device substrate and a cap substrate are shown separately.

FIG. 1 is a plan view showing a device substrate 1 of a semiconductor device according to Embodiment 1 viewed from directly above and shows an inner configuration of a semiconductor device. FIG. 2 is a perspective view showing separately a device substrate 1 shown in FIG. 1 and a cap substrate 2 functions as a cap which is put on the device substrate 1 so as to make an airtight state. On the device substrate 1, a semiconductor circuit mainly comprising elements such as a transistor 50, a transistor 51, etc. is mounted, and on a peripheral part of a surface on which a semiconductor circuit is mounted, a sealing frame of a conductor at a side of a device substrate 301 is formed. On a semiconductor circuit, at a part where connection to other than a circuit on the device substrate 1 is necessary, bumps are formed. In the example shown in FIG. 1 and FIG. 2, a bump 110 is formed at a gate electrode of the transistor 50, a bump 140 is formed at a drain electrode, a bump 120 is formed at a gate electrode of the transistor 51 and a bump 130 is formed at a drain electrode. A source electrode of each transistor is connected to a ground electrode which is formed on a back surface through a via part which penetrates between a front surface and a back surface of the device substrate 1. The transistor 50 and the transistor 51 constitute a high frequency amplifier, individually. That is, a semiconductor device having a configuration shown in FIG. 1 has two high frequency amplifiers.

On the other hand, on the cap substrate 2, a port 7, a port 8, a port 9 and a port 10, which are constituted by electrode pads which are arranged on the cap substrate 2 and via parts of conductors which penetrate between a front surface and a back surface of the cap substrate 2, are formed. Further, at a part of the cap substrate 2 to which the sealing frame at a side of a device substrate 301 of the device substrate 1 is joined, that is, in a peripheral part of a back surface which is at a side of the device substrate 1, a sealing frame at a side of a cap substrate 302, which is a conductor, is formed. Further, a port 11, a port 12, a port 13 and a port 14 are formed. Further, the port 7, the port 8, the port 9 and the port 10 which are formed in a peripheral part are electrically connected to the sealing frame at a side of a cap substrate 302 and the above mentioned ports do not penetrate the sealing frame at a side of a cap substrate 302.

The sealing frame at a side of a device substrate 301 and the sealing frame at a side of a cap substrate 302 are joined air-tightly with a conductive joining material such as a solder. By joining air-tightly, between the device substrate 1 and the cap substrate 2, space having a thickness which is total of a thickness of the sealing frame at a side of a device substrate 301 (for example, 20 µm) and a thickness of the sealing frame at a side of a cap substrate 302 (for example, 2 µm) is formed, and the space, that is, an area where a semiconductor circuit such as the transistor 50 or the transistor 51, etc. is mounted can be made air-tight state. A joint where the sealing frame at a side of a device substrate 301 and the sealing frame of a conductor at a side of a cap substrate 302 are joined functions as a sealing frame, therefore, the joint will be referred to a sealing frame 30. Regarding the sealing frame 30, it is also acceptable such that a thickness of the sealing frame at a side of a cap substrate 302 is larger than that of the sealing frame at a side of a device substrate 301, for example, a thickness of the sealing frame at a side of a device substrate 301 is 2 µm and a thickness of the sealing frame at a side of a cap substrate 302 is 20 µm, and it is only necessary to configure a semiconductor device having a hollow configuration by forming space in an area where a semiconductor circuit is mounted by the sealing frame 30 which is provided between the device substrate 1 and the cap substrate 2. In a perspective view of FIG. 2, as shown with a broken arrow, the port 7 which is provided in the cap substrate 2 is electrically connected to the sealing frame 30 at a position of a port part 70 which is shown with black circle 70 in FIG. 1 and FIG. 2. In the same way, the port 8 is electrically connected to the sealing frame 30 at a position of a port part 80, the port 9 is electrically connected to the sealing frame 30 at a position of a port part 90 and the port 10 is electrically connected to the sealing frame 30 at a position of the port part 100, individually. Further, the port 11 in the cap substrate 2 is connected to a bump 110 on the device substrate 1, the port 12 is connected to a bump 120, the port 13 is connected to a bump 130 and the port 14 is connected to a bump 140, individually.

In this application, the sealing frame 30 is used as a high frequency circuit member such as a line which transmits high frequency power. Impedance of a line when the sealing frame 30 is used as a line is determined by a dielectric constant and a thickness of the device substrate 1 and the cap substrate 2, and a width of the sealing frame 30 which is a conductor constituting a line. Regarding the sealing frame 30 as a joint, a part of an area which is indicated with a reference character 31, that is, an area, from the port part 70 which is electrically connected to the port 7 to the port part 100 which is electrically connected to the port 10, refers to a sealing part 31. In the same way, a part from the port part 70 to the port part 80 refers to a sealing frame part 32, a part from the port part 80 to the port part 90 refers to a sealing frame part 33 and a part from the port part 90 to the port part 100 refers to a sealing frame part 34. For example, in a case where target characteristic impedance of a line of a semiconductor circuit is $Z_0$, characteristics of each sealing frame part will be set as follows. Regarding a part of the sealing frame part 31 and the sealing frame part 33, a width is adjusted for impedance to be $Z_0/\sqrt{2}$ and a length of a line is adjusted to be $\lambda/4$ at operation frequency of the semiconductor circuit. Regarding a part of the sealing frame part 32 and the sealing frame part 34, a width is adjusted for impedance to be $Z_0$ and a length of a line is adjusted to be $\lambda/4$ at the operation frequency. A configuration which is constituted by the sealing frame 30 having the above mentioned configuration of the sealing frame part and four ports, that is, the port 7, the port 8, the port 9 and the port 10 which are connected to the sealing frame 30 is a configuration which is referred to so-called 90-degree hybrid circuit.

Figure 3:
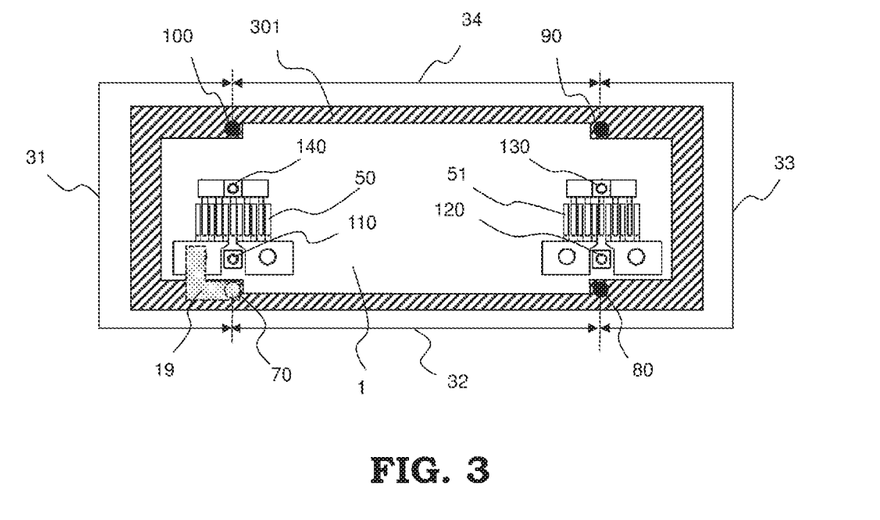
FIG. 3 is a plan view showing an example of actual configuration of a device substrate of a semiconductor device according to Embodiment 1.
Figure 4:
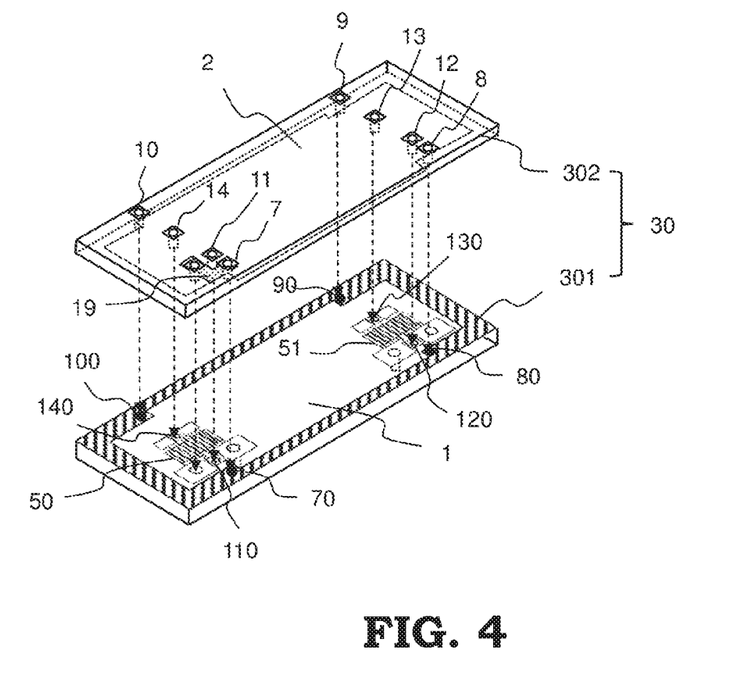
FIG. 4 is a perspective view showing an example of actual configuration of a semiconductor device according to Embodiment 1 in which a device substrate and a cap substrate are shown separately.

In a case where a semiconductor device is actually used, as shown in FIG. 3 and FIG. 4, the port part 70, that is, the port 7 is grounded together with a source electrode of a transistor via a resistor 19 which is provided at a side of the cap substrate 2. Further, it is configured such that the port 9 and the port 12 are connected via a matching circuit which is formed on a front surface or a back surface of the cap substrate 2, for example, and the port 10 and the port 11 are connected via a matching circuit which is formed on a front surface or a back surface of the cap substrate 2, for example, so as for high frequency power to be inputted from the port 8. However, it is not limited to the above mentioned configuration. A configuration, in which any of one port among the port 7, the port 8, the port 9 and the port 10 is an input port which inputs high frequency power, a port, where high frequency power which is transmitted clockwise from the input port and high frequency power which is transmitted counterclockwise from the input port are antiphase (phase difference of 180 degrees), is grounded via a resistor, between one port of other two ports and the port 11, and between other port and the port 12, matching circuits are inserted, individually, may be acceptable.

For example, as shown in FIG. 3 and FIG. 4, in a case where the port 7 is grounded via the resistor 19 and high frequency power is inputted from the port 8, high frequency power whose phase is different by 90 degrees and which has equal electric power is distributed to the port 9 and the port 10. That is, the sealing frame 30 as a joint is formed for a width and a length of the sealing frame part 31, the sealing frame part 32 and the sealing frame part 33 and the sealing frame part 34 to be satisfied by the above mentioned conditions, and each of the port 7, the port 8, the port 9 and the port 10 is directly connected to the sealing frame 30, as a result, a hollow configuration while keeping air-tight condition can be realized, and a sealing frame itself can be functioned as a member of 90-degree hybrid circuit. Further, the port 14 to which a drain of the transistor 50 is connected and the port 13 to which a drain of the transistor 51 is connected are ports from which high frequency power which is amplified by transistors is taken out.

In the above, a configuration, in which the port 7, the port 8, the port 9 and the port 10 are provided in the cap substrate 2 and resistors and matching circuits which are provided in the cap substrate 2 are connected to the above mentioned ports, individually, was described. However, a configuration, in which a matching circuit, etc. is provided on the device substrate 1, a port other than a port which inputs high frequency power is not provided, on the device substrate 1, for example, a resistor is connected to the port part 70 of the sealing frame at a side of a device substrate 301 shown in FIG. 3, for example, between the port part 90 and a gate electrode of the transistor 51 and between the port part 100 and a gate electrode of the transistor 50, matching circuits are connected, individually, may be accepted. As above mentioned, a configuration in which a port which is connected to a sealing frame is not provided in the cap substrate 2, and a sealing frame is connected to a matching circuit, etc. which is provided on the device substrate 1, may be accepted. In the same way, the above mentioned is acceptable for a configuration which will be described in the following.

In the above mentioned example of connecting, the sealing frame 30 is used as a circuit member of a divider, however, the sealing frame 30 can be used as a circuit member of a combiner. In a configuration shown in FIG. 3 and FIG. 4, when high frequency powers having same frequency and phase which is different by 90 degrees are inputted to the port 9 and the port 10, high frequency power which is combined can be outputted from the port 8. That is, when the port 7 is grounded via the resistor 19, for example, the port 14 and the port 10 are connected via a matching circuit, and the port 13 and the port 9 are connected via a matching circuit, the sealing frame 30 can be used as a combiner which combines high frequency powers which are amplified by the transistor 50 and the transistor 51, and high frequency power output which is combined can be taken out from the port 8. It is necessary for two high frequency powers to be combined to be high frequency powers whose phases at a position of the port 9 and the port 10 are different by 90 degrees each other. It is not limited to the above mentioned, when any one port among the port 7, the port 8, the port 9 and the port 10 is set to be a port which outputs high frequency power, from two ports among other three ports, high frequency powers whose phases are different by 90 degrees are inputted, and other port is grounded via a resistor, high frequency power which is combined can be taken out from the output port.

In the above mentioned, a semiconductor device has the configuration in which the sealing frame 30 is used as a line of high frequency and four ports are provided connecting to the sealing frame 30 so as to function as a divider in which a circuit which is constituted by the sealing frame 30 and four ports distributes high frequency power to two high frequency amplifiers or as a combiner which combines high frequency powers which are outputted from two high frequency amplifiers. It is not limited to the above mentioned, for example, it is possible to configure such that in an area which is sealed air-tightly by a sealing frame, three high frequency amplifiers are provided and six ports connecting to a sealing frame are provided so as to distribute high frequency powers to three high frequency amplifiers or so as to combine high frequency powers from three high frequency amplifiers.

As above mentioned, a divider or a combiner, which is mounted separately from a semiconductor device having a hollow configuration due to the problem regarding mounting space conventionally, can be realized by adding a function as a 90-degree hybrid circuit to a sealing frame itself, therefore an mounting area can be reduced significantly and processes for mounting of a divider or a combiner can be reduced. Further, only by changing a mask for process, a function can be added, therefore, in comparison with purchasing an external divider or an external combiner, mounting can be realized with lower cost. Especially, regarding a high frequency band such as Ku band, a size of a circuit becomes smaller, and in comparison with arranging a divider or a combiner on an external substrate, an effect of miniaturizing can be increased.

Embodiment 2

Figure 5:
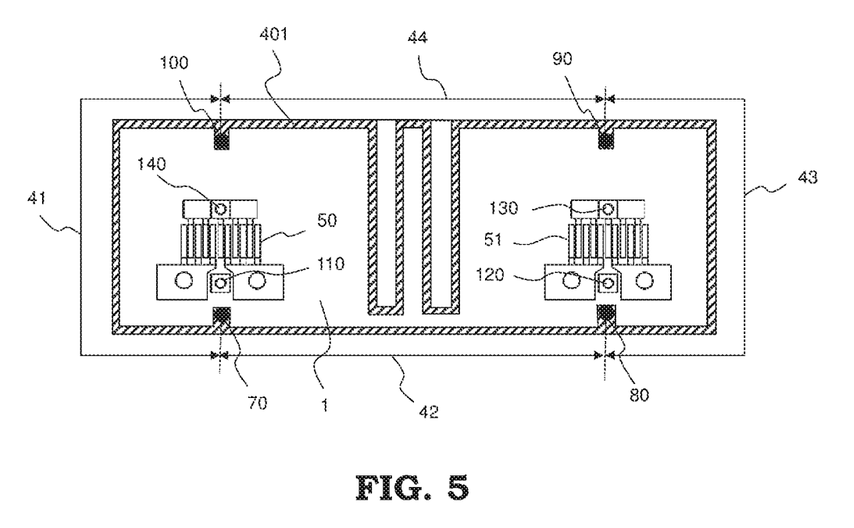
FIG. 5 is a plan view showing a basic configuration of a semiconductor device according to Embodiment 2.
Figure 6:
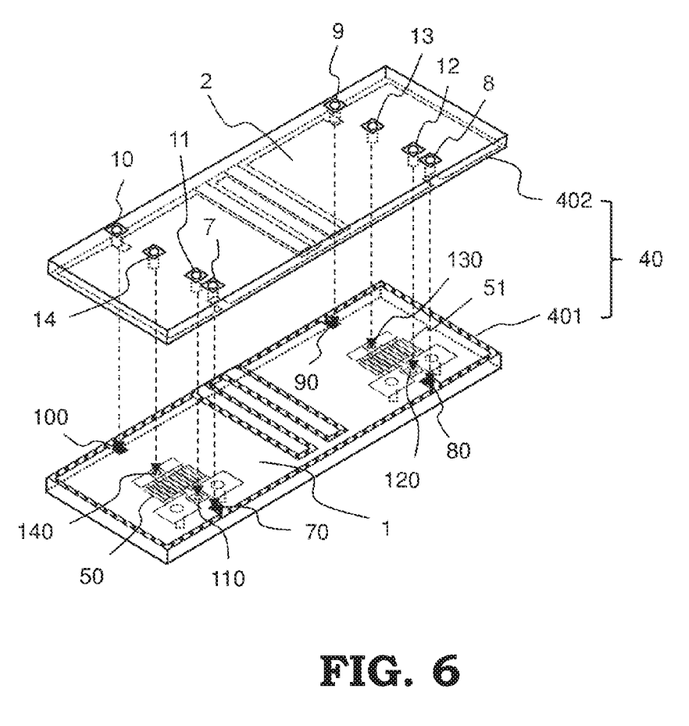
FIG. 6 is a perspective view showing a basic configuration of a semiconductor device according to Embodiment 2 in which a device substrate and a cap substrate are shown separately.

FIG. 5 is a plan view showing a device substrate 1 of a semiconductor device according to Embodiment 2 which is viewed from directly above and shows an inner configuration of a semiconductor device. FIG. 6 is a perspective view showing separately a device substrate 1 shown in FIG. 5 and a cap substrate 2 which functions as a cap which is put on the device substrate 1 so as to make an airtight state. In the same way as that of Embodiment 1, in the device substrate 1, a semiconductor circuit mainly comprising elements such as a transistor 50, a transistor 51, etc. is mounted, and on a surface where a semiconductor circuit is mounted, a sealing frame of a conductor at a side of a device substrate 401 is formed. On a semiconductor circuit, at parts which are necessary connected to other than circuits on the device substrate 1, bumps are formed. In an example of FIG. 5 and FIG. 6, a bump 110 is formed at a gate electrode of the transistor 50, a bump 140 is formed at a drain electrode, a bump 120 is formed at a gate electrode of the transistor 51 and a bump 130 is formed at a drain electrode, individually. A source electrode of each transistor is connected to a ground electrode which is formed on a back surface through a via part which penetrates between a front surface and a back surface of the device substrate 1.

On the other hand, in the cap substrate 2, in the same way as that of Embodiment 1, a port 7, a port 8, a port 9 and a port 10 which are constituted by electrode pads which are arranged on the cap substrate 2 and via parts of conductors which penetrate between a front surface and a back surface of the cap substrate 2. Further, at a part of the cap substrate 2 where the sealing frame at a side of a device substrate 401 of the device substrate 1 is joined, that is, a part which corresponds to the sealing frame at a side of a device substrate 401 on a back surface of the cap substrate 2, a sealing frame of a conductor at a side of a cap substrate 402 is formed. Further, a port 11, a port 12, a port 13 and a port 14 are formed. Further, the port 7, the port 8, the port 9 and the port 10 are electrically connected to the sealing frame at a side of a cap substrate 402, and the above mentioned ports do not penetrate the sealing frame at a side of a cap substrate 402.

The sealing frame at a side of a device substrate 401 and the sealing frame at a side of a cap substrate 402 are air-tightly joined with a conductive joining material such as a solder. By air-tightly joining the sealing frame at a side of a device substrate 401 and the sealing frame at a side of a cap substrate 402, between the sealing frames, space having a thickness which is total of a thickness of the sealing frame at a side of a device substrate 401 and a thickness of the sealing frame at a side of a cap substrate 402 is formed, and the space, that is, an area where the transistor 50 and the transistor 51 are mounted, can be made to be airtight state. A joint where the sealing frame at a side of a device substrate 401 and the sealing frame at a side of a cap substrate 402 are joined functions as a sealing frame, therefore, the joint will be referred to a sealing frame 40. In a perspective view of FIG. 6, as shown with a broken arrow, the port 7 which is provided in the cap substrate 2 is electrically connected to a sealing frame 30 at a position of the port part 70 which is shown with a black circle 70 in FIG. 5 and FIG. 6. In the same way, the port 8 is electrically connected to the sealing frame 40 at a position of the port part 80, the port 9 is electrically connected to the sealing frame 40 at a position of the port part 90 and the port 10 is electrically connected to the sealing frame 40 at a position of the port part 100, individually. Further, the port 11 in the cap substrate 2 is connected to a bump 110 on the device substrate 1, the port 12 is connected to a bump 120, the port 13 is connected to a bump 130 and the port 14 is connected to a bump 140, individually.

The sealing frame 40 is used as a line of high frequency, and the sealing frame 40 is formed with following characteristics as a line of high frequency. In the sealing frame 40, a part which is shown with reference character 41, that is, from the port part 70 which is connected to the port 7, to the port part 100 which is connected to the port 10, is referred to a sealing frame part 41. In the same way, a part from the port part 70 to the port part 80 is referred to a sealing frame part 42, a part from the port part 80 to the port part 90 is referred to a sealing frame part 43, and a part from the port part 90 to the port part 100 is referred to a sealing frame part 44. In the sealing frame 40, regarding the sealing frame part 41, the sealing frame part 42 and the sealing frame part 43, for example in case where target characteristic impedance of line of a semiconductor device is set to be $Z_0$, a width is adjusted for impedance to be $\sqrt{2} \times Z_0$, and a length of the line is adjusted to be $\lambda/4$ at operation frequency of a semiconductor circuit. In the sealing frame 40, a width of a part of the sealing frame part 44 is adjusted for impedance to be $\sqrt{2} \times Z_0$ when target characteristic impedance of a line of a semiconductor device is set to be $Z_0$, for example, and a length of a line is adjusted to be $\lambda \times (3/4)$ at operation frequency. The configuration comprising the sealing frame 40 having the above mentioned configuration of the sealing frame part, and four ports, that is, the port 7, the port 8, the port 9 and the port 10 is a configuration so-called a rat-race circuit. Further, a length of a part of the sealing frame part 44 is long, therefore, as shown in FIGs., the part is configured to be a folded line. In the above mentioned configuration, by air-tightly sealing space which is surrounded by whole of the sealing frame 40 which is provided between the device substrate 1 and the cap substrate 2, an area where the transistor 50 and the transistor 51 are mounted can be made to be airtight state.

Figure 7:
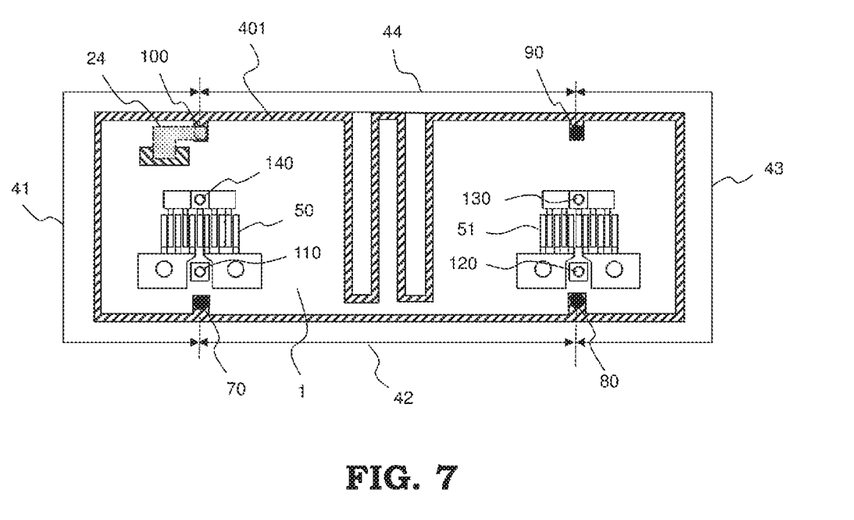
FIG. 7 is a plan view showing an example of actual configuration of a device substrate of a semiconductor device according to Embodiment 2.
Figure 8:
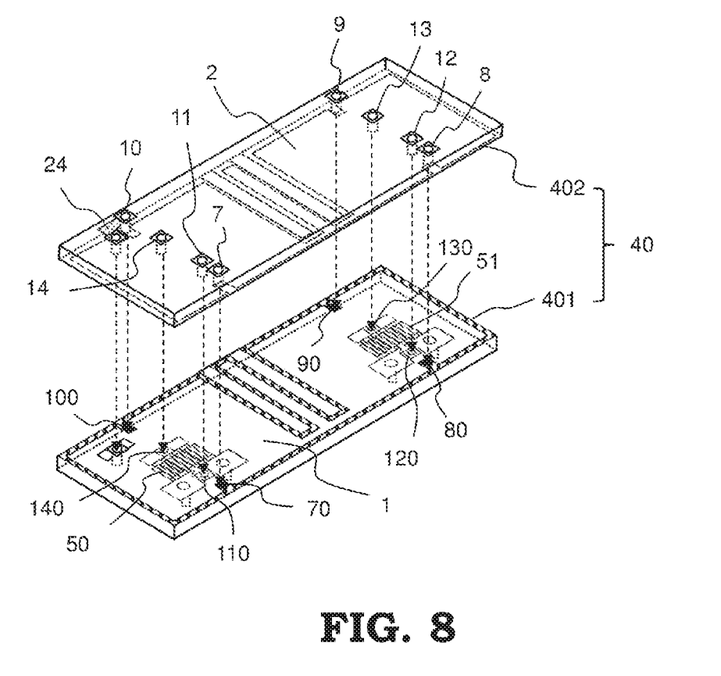
FIG. 8 is a perspective view showing an example of actual configuration of a semiconductor device according to Embodiment in which a device substrate and a cap substrate are shown separately.

In a case where a semiconductor device is actually used, as shown in FIG. 7 and FIG. 8, the port part 100, that is, the port part 10 is grounded by connecting to a ground electrode which is provided on a back surface of the device substrate 1, via a resistor 24 which is provided at a side of the cap substrate 2, for example. Further, it is configured such that the port 9 and the port 12 are connected via a matching circuit, the port 7 and the port 11 are connected via a matching circuit so as to input high frequency power from the port 8. However, it is not limited to the above mentioned configuration, it may be configured such that among any one of the port 7, the port 8, the port 9 and the port 10 is grounded via a resistor, among other three ports, between any one of the port and the port 11, and between any one of the port and the port 12, matching circuits are inserted so as to connect, and high frequency power is inputted from remaining port.

For example, as shown in FIG. 7 and FIG. 8, in a case where the port 10 is grounded via a resistor 24, high frequency power is inputted from the port 8, high frequency powers having a same phase and equal power are distributed to the port 7 and the port 9. That is, when a width and a length of each sealing part of the sealing frame 40 is formed so as to satisfy the above mentioned conditions and the port 7, the port 8, the port 9 and the port 10 are directly connected to the sealing frame 40, a hollow configuration while maintaining airtight state can be realized and the sealing frame 40 itself can function as a member of a rat-race circuit. Further, the port 14 to which a drain of the transistor 50 is connected and the port 13 to which a drain of the transistor 51 is connected are ports to take out high frequency powers which are amplified by the transistor.

The above mentioned connecting examples are examples in which the sealing frame 40 is used as a circuit member of a divider, however, the sealing frame 40 may be used as a circuit member of a combiner. When the port 10 is grounded via the resistor 24, for example, the port 7 and the port 14 are connected via a matching circuit, and the port 9 and the port 13 are connected via a matching circuit, the sealing frame 40 can be used as a combiner which combines high frequency powers which are amplified by the transistor 50 and the transistor 51, and from the port 8, high frequency power which is combined can be taken out. It is necessary for two high frequency powers to be combined to have same phase at a position of the port 7 and the port 9 which are connected to the sealing frame 40. It is not limited to the above mentioned, when any one port of the port 7, the port 8, the port 9 and the port 10 is a port to output high frequency power, from two ports among other three ports, high frequency powers having same phase or a phase which is different by 180 degrees in accordance with a configuration of a port are inputted, and other port is grounded via a resistor, high frequency power which is combined can be taken out from an output port.

A divider or a combiner, which is mounted separately from a semiconductor device having a hollow configuration due to the problem regarding mounting space conventionally, can be realized by adding a function as a rat race to a sealing frame itself, therefore a mounting area can be significantly reduced and processes for mounting a divider or a combiner can be reduced. Further, a function can be added only by changing a mask for process, in comparison with purchasing an external divider or an external combiner, mounting can be performed with lower cost. Especially, regarding a high frequency band such as Ku band, a size of a circuit becomes smaller, therefore in comparison with arranging a divider or a combiner on an external substrate, an effect of miniaturization can be increased.

In Embodiment 1, an example in which the sealing frame 30 and four ports configure a 90-degree hybrid circuit was described and in Embodiment 2, an example in which the sealing frame 40 and four ports configure a rat-race circuit was described, however, it is not limited to the above mentioned, a case in which high frequency power is transmitted to a sealing frame, and the sealing frame may be operated as a circuit member of high frequency other than a 90-degree hybrid circuit or a rat-race circuit is acceptable.

As above mentioned, according to a semiconductor device which is disclosed by present application, it is configured such that a sealing frame is operated as a circuit member of high frequency, therefore, it can be configured such that a sealing frame can be used as a circuit member of high frequency which was mounted separately from a sealing frame, therefore, an effect of miniaturization of a semiconductor device can be obtained.

Although the present application is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

EXPLANATION OF REFERENCE CHARACTERS 1 device substrate
2 cap substrate
7, 8, 9, 10 port
30, 40 sealing frame
50, 51 transistor

The invention claimed is:

1. A semiconductor device comprising a device substrate on which a semiconductor circuit including two high frequency amplifiers is formed, a cap substrate and a sealing frame of a conductor which forms and air-tightly seals space surrounding an area, in which the semiconductor circuit is formed, between the device substrate and the cap substrate,
   wherein the sealing frame is configured as a line of a 90-degree hybrid circuit, and
   a width of plural segments of the sealing frame vary based on a target characteristic impedance.

2. A semiconductor device comprising a device substrate on which a semiconductor circuit including two high frequency amplifiers, a cap substrate and a sealing frame of a conductor which forms and air-tightly seals space surrounding an area, in which the semiconductor circuit is formed, between the device substrate and the cap substrate,
   wherein the sealing frame is a line of a rat-race circuit, a longest segment of the rat-race circuit positioned between adjacent ports of the rat-race circuit including a folded line that includes a portion folded toward the area and an other portion folded away from the area.

3. The semiconductor device according to claim 2, wherein the sealing frame is configured as a circuit member of a divider.

4. The semiconductor device according to claim 2, wherein the sealing frame is configured as a circuit member of a combiner.

5. The semiconductor device according to claim 1, wherein a port of a conductor constituted by a via part penetrating between a front surface and a back surface of the cap substrate is provided, the port is electrically connected to the sealing frame and high frequency power is transmitted to the sealing frame via the port.

6. The semiconductor device according to claim 1, wherein the sealing frame is configured as a circuit member of a distributor.

7. The semiconductor device according to claim 1, wherein the sealing frame is configured as a circuit member of a synthesizer.

8. The semiconductor device according to claim 2, wherein a port of a conductor constituted by a via part penetrating between a front surface and a back surface of the cap substrate is provided, the port is electrically connected to the sealing frame and high frequency power is transmitted to the sealing frame via the port.

* * * * *